(12) United States Patent
Spuller et al.

(10) Patent No.: US 6,786,977 B2
(45) Date of Patent: Sep. 7, 2004

(54) GAS-EXPANDED LIQUIDS, METHODS OF USE THEREOF, AND SYSTEMS USING GAS-EXPANDED LIQUIDS FOR CLEANING INTEGRATED CIRCUITS

(75) Inventors: Matthew T. Spuller, Atlanta, GA (US); Dennis W. Hess, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 10/719,716

(22) Filed: Nov. 21, 2003

(65) Prior Publication Data

US 2004/0103924 A1 Jun. 3, 2004

Related U.S. Application Data

(60) Provisional application No. 60/428,121, filed on Nov. 21, 2002.

(51) Int. Cl.[7] ................................................. B08B 3/00
(52) U.S. Cl. ............................... 134/34; 134/2; 134/38; 134/40; 134/42; 134/56 R; 134/902; 428/543
(58) Field of Search ............................ 134/34, 3, 2, 38, 134/40, 42, 56 R, 902; 428/543

(56) References Cited

U.S. PATENT DOCUMENTS 6,734,112 B2 * 5/2004 Worm et al. ................. 438/745
2002/0045347 A1   4/2002 Worm et al.

OTHER PUBLICATIONS

Chang et al, Solvent Expansion and Solute Solubility Predictions in Gas–Expanded Liquids, AIChE Journal, vol. 36, No. 6, p. 939–942, Jun. 1990.*

* cited by examiner

Primary Examiner—Alexander Markoff
(74) Attorney, Agent, or Firm—Thomas, Kayden, Horstemeyer & Risley, LLP

(57) ABSTRACT

Gas-expanded liquids, methods of use thereof, and systems of using gas-expanded liquids are provided. One exemplary system, among others, includes: a gas-expanded liquid system comprising a gas and a liquid, wherein the gas-expanded liquid system is adapted to generate a gas-expanded liquid; and a substrate handling system adapted to position a substrate having a photoresist layer so that the gas-expanded liquid can be made to contact the substrate to remove the photoresist layer.

19 Claims, 3 Drawing Sheets

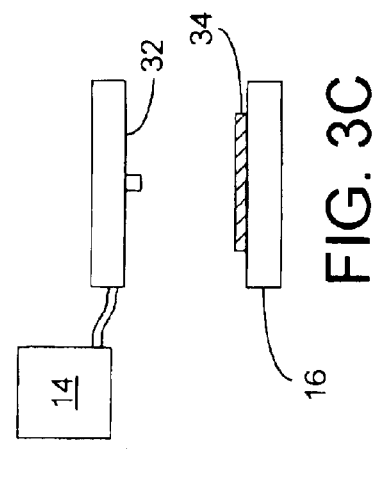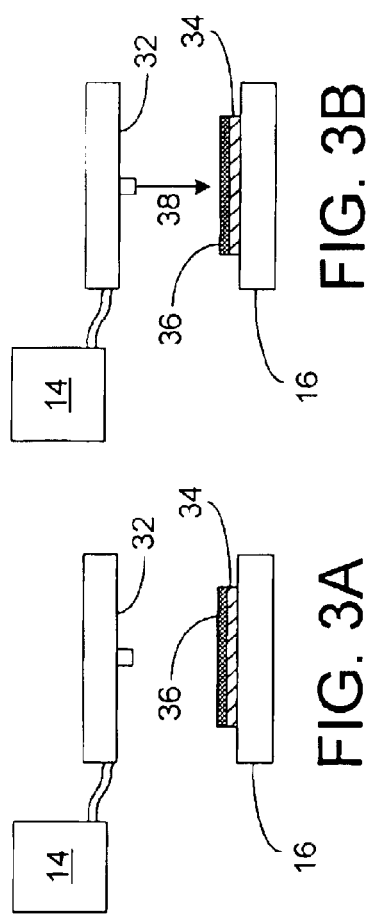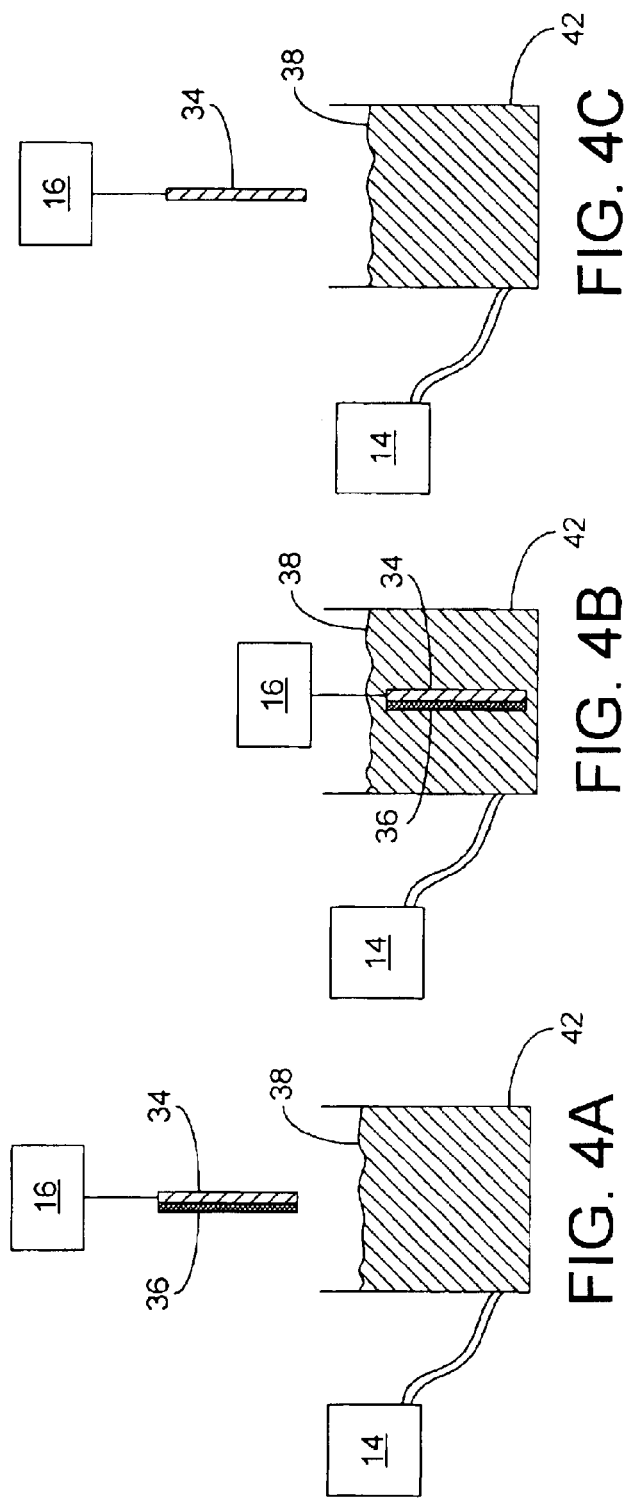

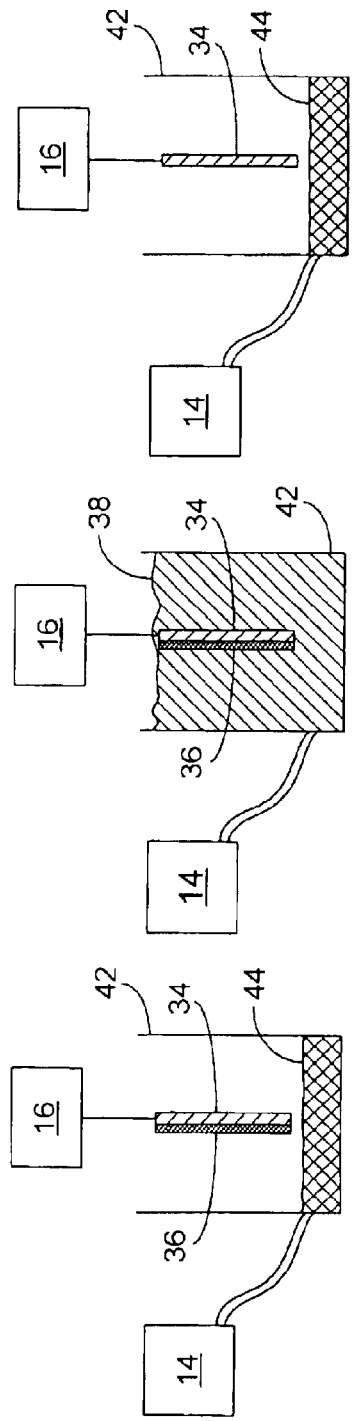
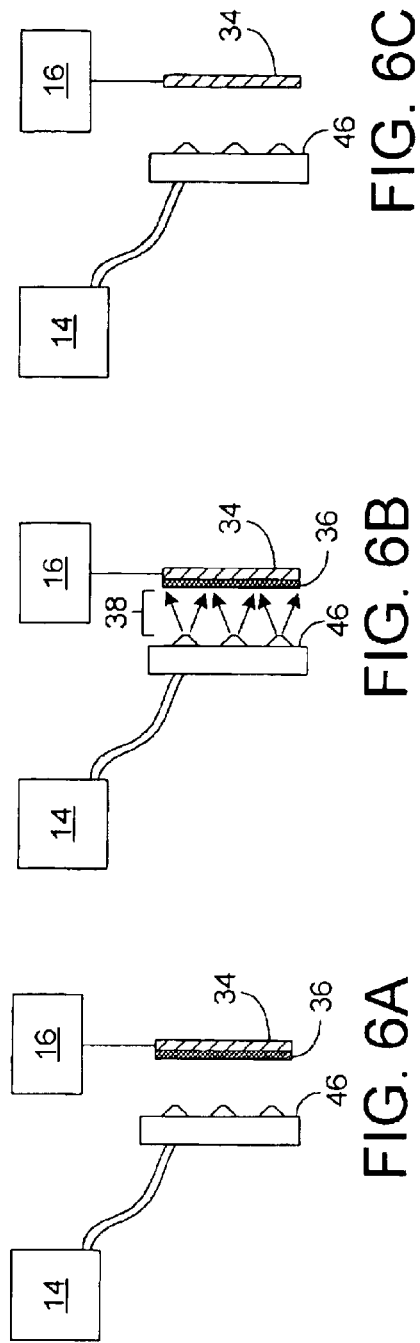

GAS-EXPANDED LIQUIDS, METHODS OF USE THEREOF, AND SYSTEMS USING GAS-EXPANDED LIQUIDS FOR CLEANING INTEGRATED CIRCUITS

CROSS-REFERENCE TO RELATED APPLICATION

This application claims priority to U.S. provisional application entitled "Using Gas-Expanded Liquids for Photoresist Stripping and Post-Etch Residue Removal in Microelectronics Processing" having Ser. No. 60/428,121, filed on Nov. 21, 2002, which is entirely incorporated herein by reference.

TECHNICAL FIELD

This disclosure is generally related photoresist removal, and, more particularly, is related to gas-expanded liquids, methods of use thereof, and systems of using gas-expanded liquids.

BACKGROUND

Photoresist removal is one of the most critical and most repeated cleaning processes in the fabrication of an integrated circuit (IC). Fabrication of a state-of-the-art ICs includes the use of over twenty-five masking steps, each utilizing a photoresist for pattern generation, and each requiring a subsequent photoresist removal process. Photoresist exposed to processes such as ion implantation and plasma reactive ion etching becomes a heavily carbonized, hardened polymeric residue that can be particularly difficult to remove. Current commercial chemical formulations can be ineffective in removing these etch residues.

Commercial liquids range from organic to aqueous and acidic to basic, but they often share the common property of being environmentally hazardous with regard to flammability, human health, and pollution. In addition, limitations may exist in using liquids to process nanoscale features. For instance, viscosity, surface tension, and diffusivity of liquids may inhibit mass transport and surface wetting. Supercritical and liquid carbon dioxide ($CO_2$) has been proposed as alternatives to conventional liquids, but these are limited by the high pressures required in these systems, which must be at least the vapor pressure of $CO_2$ for liquid-phase operation and, in some cases, up to several thousand pounds per square inch (psi) for supercritical fluids.

Thus, a heretofore unaddressed need exists in the industry to address the aforementioned deficiencies and/or inadequacies.

SUMMARY

Briefly described, embodiments of this disclosure, among others, include gas-expanded liquids, methods of use thereof, and systems of using gas-expanded liquids. One exemplary system, among others, includes: a gas-expanded liquid system comprising a gas and a liquid, wherein the gas-expanded liquid system is adapted to generate a gas-expanded liquid; and a substrate handling system adapted to position a substrate having a photoresist layer so that the gas-expanded liquid can be made to contact the substrate to remove the photoresist layer.

An exemplary method of cleaning a substrate, among others, includes: providing the substrate having a photoresist layer disposed thereon; exposing at least a portion of the substrate to a gas-expanded liquid; and removing the photoresist layer from the exposed area of the substrate.

Other systems, methods, features, and advantages will be, or become, apparent to one with skill in the art upon examination of the following drawings and detailed description. It is intended that all such additional systems, methods, features, and advantages be included within this description, be within the scope of this disclosure, and be protected by the accompanying claims.

BRIEF DESCRIPTION OF THE DRAWINGS

Many aspects of this disclosure can be better understood with reference to the following drawings. The components in the drawings are not necessarily to scale, emphasis instead being placed upon clearly illustrating the principles of this disclosure. Moreover, in the drawings, like reference numerals designate corresponding parts throughout the several views.

FIGS. 3A through 3C are schematics illustrating a representative flow method for cleaning photoresist from a substrate.

FIGS. 4A through 4C are schematics illustrating a representative submersion method for cleaning photoresist from a substrate.

FIGS. 5A through 5C are schematics illustrating another representative submersion method for cleaning photoresist from a substrate.

FIGS. 6A through 6C are schematics illustrating a representative spray method for cleaning photoresist from a substrate.

DETAILED DESCRIPTION

In general, gas-expanded liquids, methods of use thereof, and systems of using gas-expanded liquids for cleaning integrated circuits and the like, are disclosed. Gas-expanded liquids can be described as a liquid containing a substantially miscible gas at elevated pressures, but below the pressure at which the pure gas component would be liquefied. An example of this combination is a closed system in which a gas such as carbon dioxide ($CO_2$) is in equilibrium with a liquid such as ethanol. At low pressures (about 1 atmosphere (atm)), the amount of carbon dioxide that is in the liquid phase is minimal. However, at elevated pressures, carbon dioxide has significant solubility in ethanol, and the total volume of the liquid phase increases. As a result, the composition of the gas-expanded liquid can be controllably-adjusted to include different amounts of gas and liquid, at lower pressures than that required for obtaining similar compositions with liquid or supercritical $CO_2$.

Due to their unique range of properties, gas-expanded liquids overcome at least some of the limitations of traditional liquid solvents and supercritical liquids. The physical properties of gas-expanded liquids range between those of the pure components, suggesting that excellent mass transport and excellent solvent strength can be achieved. For example, the solvent strength of gas-expanded liquids is much greater than that of gases or supercritical fluids, while the surface tension and viscosity of gas-expanded liquids is much lower than that of liquids. In addition to these improved properties, the volume of organic solvent desired for cleaning can be significantly reduced. Concurrently, the operating pressures for using gas-expanded liquids are below those comparatively used with liquid $CO_2$ and supercritical $CO_2$ processes.

As the composition of the gas-expanded liquid is modified, the physical properties (e.g., viscosity, diffusivity, and density) are similarly modified over the range of the pure component properties. Hence, the properties (e.g., for solubilization of residues, removal of photoresists, and penetration of shallow trenches) of the liquid phase are tunable.

The physical parameters of the gas-expanded liquid as a function of composition can be approximated from the pure component data. The physical properties of ethanol (EtOH) and $CO_2$, for example, as shown in Table 1, provide an indication of the range over which the properties of the gas-expanded liquid may be tuned.

TABLE 1

The viscosity ($\mu$), surface tension ($\gamma$), and density ($\rho$) of ethanol and liquid carbon dioxide.

|  | EtOH | L—$CO_2$ | units |
|---|---|---|---|
| $\mu \downarrow$ | 1.0 | .06–.09 | mPa-s |
| $\gamma \downarrow$ | 22 | 1.5 | mN/m |
| $\rho \sim$ | 780 | 500–900 | kg/m$^3$ |

Figure 1:
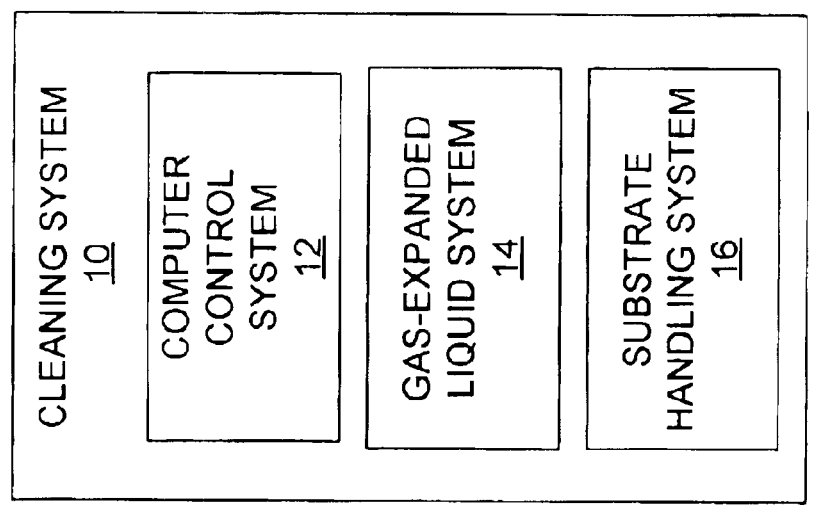
FIG. 1 illustrates a representative photoresist cleaning system.

FIG. 1 illustrates a representative photoresist cleaning system 10. The photoresist cleaning system 10 includes a computer control system 12, a gas-expanded liquid system 14, and a substrate handling system 16. The computer control system 12 is configured to coordinate the operations of the gas-expanded liquid 14 and the substrate handling system 16 to remove a photoresist layer from a substrate. The phrase "remove (removing) a photoresist layer" as used herein, is intended to encompass removing all of or a substantial portion of the photoresist layer.

The gas-expanded liquid system 14 is adapted to generate and/or transport the gas-expanded liquid and the precursor gas-expanded liquid components. In addition, the gas-expanded liquid system 14 can be used to recycle the precursor gas-expanded liquid components. The gas-expanded liquid system 14 includes equipment (e.g., storage containers, mixing chamber, photoresist cleaning chamber, gas regulators, flow controllers, high pressure pumps, compressors, and gas and liquid manifolds) to generate, store, and transport the components used to form the gas-expanded liquid. Furthermore, the gas-expanded system 14 can include gas-expanded liquid flow and spray systems to disperse the gas-expanded liquid.

For example, the gas-expanded liquid system 14 can be used to generate gas-expanded liquids using a pair of high pressure syringe pumps (a gas pump and a liquid pump), a mixing chamber, and a manifold system. The gas pump is operated in constant pressure mode for maintaining the pressure setpoint (and thus composition of the gas-expanded liquid), while the liquid pump is operated in constant flow mode and used for controlling the delivery of liquid.

The liquid pump is first loaded with the liquid. When the system is depressurized and all valves are closed, a liquid inlet valve on the liquid pump is opened and the inlet tube is placed in a reservoir of the liquid. The refill rate of the liquid pump is set at a known value (e.g., about 40 mL/min). Filling of the liquid pump is stopped after it is loaded with the desired amount of liquid. The liquid inlet valve is then closed and the liquid pump contents are delivered to the mixing chamber.

To pressurize the system with the gas, the gas cylinder supply is opened to the gas pump. The gas pump is filled to a sufficient volume such that the gas-expanded liquid can be formed. After the gas pump is full, the valve to the mixing chamber is opened. The gas pump is operated in constant pressure mode at the setpoint.

To maintain control of the vapor-liquid phase equilibrium concentrations, each region of the equipment through which fluid is transported is maintained at the specific temperature setpoint. Deviations from this setpoint can shift concentrations in the gas-expanded fluid. Therefore, the gas and the liquid pump, mixing chamber, and manifold are each equipped with an independent heater and thermocouple.

The precursor gas-expanded liquid components that can be used to form the gas-expanded liquid include a gas and a liquid. In general, the gas is substantially miscible in the liquid. The pressure of the system should be less than the vapor pressure of the gas at a constant temperature. Also, adjusting the pressure and/or the temperature can modify the composition of the gas in the gas-expanded liquid. In addition, it is preferred that the gas and the liquid not substantially react with one another. The gas can include gases such as, but not limited to, carbon dioxide, ethane, and nitrous oxide. The liquid can include non-aqueous compounds such as, but not limited to, alcohols (e.g., methanol, ethanol, and isopropyl alcohol), ketones (e.g., n-methyl pyrrolidone (NMP) and acetone), organic acids (e.g., acetic acid), and hydrocarbons (e.g., alkanes (e.g., pentane and hexane), and alkenes (e.g., benzene and toluene)).

The substrate handling system 16 is adapted to transport the substrate into, out of, and within the photoresist cleaning system 10. In particular, the substrate handling system 16 positions the substrate so that the photoresist can be removed with the gas-expanded liquid. The substrate handling system 16 includes equipment such as, for example, a load lock valve, a wafer transport arm, and a wafer platen.

The substrate can include, for example, a chip, a high speed and high performance chip such as a microprocessor, communication chip, and optoeletronic chip, at any stage of processing. The substrate can be made of materials such as, for example, silicon, silicon compounds, germanium, germanium compounds, gallium, gallium compounds, indium, indium compounds, or other semiconductor materials and/or compounds. In addition, the substrate can include non-semiconductor substrate materials, including any dielectric material, metals (e.g., copper and aluminum), or ceramics or organic materials found in printed wiring boards, for example.

The photoresist material can include photoresist used at any stage of processing of the substrate. As a result, the photoresist layer may have been exposed to processes such as, but not limited to, ion implantation, reactive ion etching and combinations thereof. After exposure to these processes, the photoresist may become carbonized and contain hardened photoresist residue that is difficult to remove. The photoresist layer can include photoresist materials such as, but not limited to, polyhydroxystyrene, novolac (phenol formaldehyde), and polymethylmethacrylate.

Figure 2:
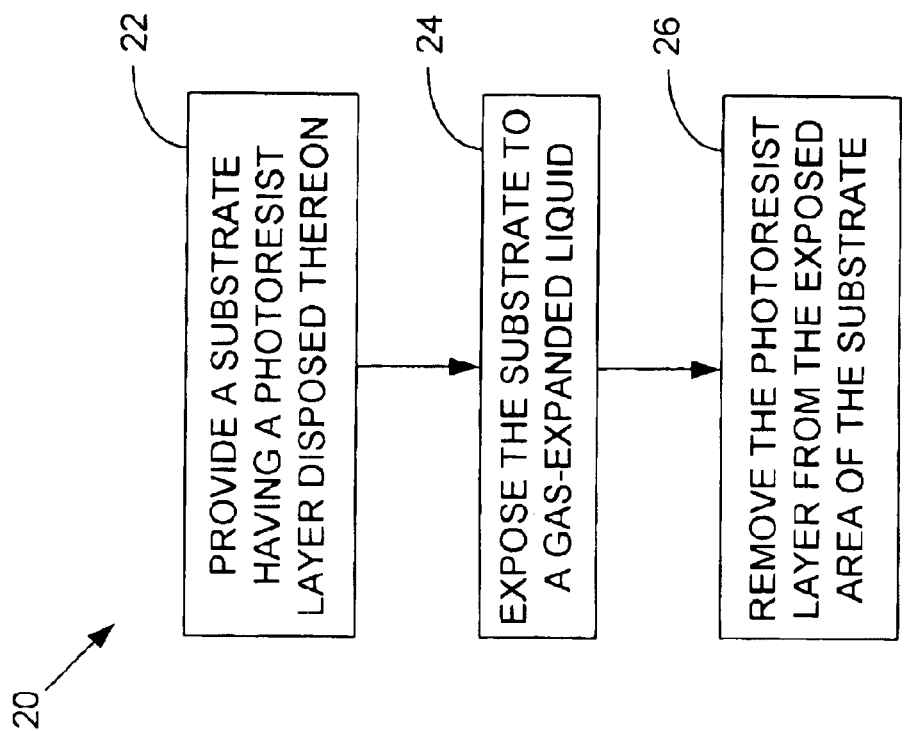
FIG. 2 illustrates a flow chart of a representative method for cleaning photoresist from a substrate.

FIG. 2 illustrates a flow chart of a representative method 20 for cleaning a photoresist layer from a substrate. In block 22, the substrate having the photoresist layer disposed thereon is provided. For example, the substrate handling system 16 can be used to transport the substrate into the photoresist cleaning system 10. In block 24, the substrate is exposed to the gas-expanded liquid provided by the gas-expanded liquid system 14. For example, the substrate can be submerged in a gas-expanded liquid and/or a gas-expanded liquid can be flowed and/or sprayed onto the substrate. In block 26, the photoresist layer is substantially removed from the substrate after exposure to the gas-expanded liquid. The photoresist can dissolve and/or swell and release from the substrate surface.

Now having described the gas-expanded liquids, methods of use thereof, and systems of using gas-expanded liquids in general, the following describes exemplar embodiments for removing photoresist from substrates. These examples are not intended to limit the scope of any embodiment of this disclosure, but rather is intended to provide specific exemplary methods. Therefore, one skilled in the art would understand that many conditions can be modified to produce a desired result, and it is intended that these modifications be within the scope of the embodiments of this disclosure.

FIGS. 3A through 3C are schematics illustrating a representative flow method for cleaning a photoresist layer 36 from a substrate 34. FIG. 3A illustrates a gas-expanded liquid system 14 having a flow nozzle system 32 positioned above the substrate 34 having a photoresist layer 36. The flow nozzle system 32 and the substrate 34 are disposed in a closed, sealed chamber (not shown) that is initially pressurized with the gas (e.g., $CO_2$). The flow nozzle system 32 is adapted to flow the gas-expanded liquid onto the substrate 34. The substrate 34 is disposed on the substrate positioning system 16. It should be noted that a plurality of substrates could be included on the substrate handling system 16.

In FIG. 3B, a gas-expanded liquid 38 is flowed onto the photoresist layer 36 on the substrate 34. The gas-expanded liquid can be flowed onto the substrate 34 for a time period from about 2 to 30 minutes, but preferably less than about 5 minutes. To enhance the removal of the photoresist layer 36, the substrate positioning system 16 can be configured so that the substrate 34 can be rotated while the gas-expanded liquid 38 is flowed onto the substrate 34. The centripetal force generated by the rotation of the substrate 34 assists in the transport of the gas-expanded liquid 38 across the substrate 34 as the gas-expanded liquid 38 is flowed. FIG. 3C illustrates the substrate 34 after the photoresist layer 36 has been substantially removed from the substrate 34 using the gas-expanded liquid 38.

FIGS. 4A through 4C are schematics illustrating a representative submersion method for cleaning the photoresist layer 36 from the substrate 34. FIG. 4A illustrates a gas-expanded liquid system 14 including a container 42 filled with a gas-expanded liquid 38. The gas-expanded liquid system 14 is adapted to dispense and remove gas-expanded liquid into the container 42. In addition, a substrate handling system 16 including the substrate 34 having a photoresist layer 36 positioned above the container 42. The container 42, the substrate handling system 16, and the substrate 34 are disposed in a closed, sealed chamber (not shown) that is initially pressurized with the gas (e.g., $CO_2$). It should be noted that a plurality of substrates could be included on the substrate handling system 16.

FIG. 4B illustrates the substrate 34 submerged in the gas-expanded liquid 38 in the container 42. The container 42 should include enough gas-expanded liquid 38 to submerge the substrate 34. The substrate 34 can be submerged for a time period from about 2 to 30 minutes. FIG. 4C illustrates the substantial removal of the photoresist layer 36 from the substrate 34 using the gas-expanded liquid 38.

FIGS. 5A through 5C are schematics illustrating another representative submersion method for cleaning the photoresist layer 36 from the substrate 34. FIG. 5A illustrates a gas-expanded liquid system 14 including a container 42 filled with a liquid 44. In addition, a substrate handling system 16 including the substrate 34 having a photoresist layer 36 is positioned above the container 42. The container 42, the substrate handling system 16, and the substrate 34 are disposed in a closed, sealed chamber (not shown) that is initially pressurized with the gas (e.g., $CO_2$). It should be noted that a plurality of substrates could be included on the substrate handling system 16.

FIG. 5B illustrates the substrate 34 submerged in the gas-expanded liquid 38 in the container 42. Increasing the gas pressure in the photoresist cleaning system 10 produces the gas-expanded liquid 38. As the gas pressure increases, gas is miscible in the liquid and causes the liquid to expand. In this regard, the substrate 34 is then submerged in the gas-expanded liquid 38 upon reaching a certain gas pressure. The container 42 should include enough gas-expanded liquid 38 to submerge the substrate 34. The substrate 34 can be submerged for a time period from about 2 to 30 minutes. FIG. 5C illustrates the substantial removal of the photoresist layer 36 from the substrate 34 using the gas-expanded liquid 38.

FIGS. 6A through 6C are schematics illustrating a representative flow method for cleaning a photoresist layer 36 from a substrate 34. FIG. 6A illustrates a gas-expanded liquid system 14 having a spray nozzle system 46 (e.g., one or more spray nozzles) positioned next to the substrate 34 having a photoresist layer 36. The spray nozzle system 46 is adapted to spray gas-expanded liquid onto the substrate 34. The substrate 34 is positioned using the substrate positioning system 16. The spray nozzle system 46, the substrate handling system 16, and the substrate 34 are disposed in a closed, sealed chamber (not shown) that is initially pressurized with the gas (e.g., $CO_2$). It should be noted that a plurality of substrates could be included on the substrate handling system 16. Also, the substrate 34 could be positioned horizontally rather than vertically.

In FIG. 6B, a gas-expanded liquid 38 is sprayed onto the photoresist layer 36 on the substrate 34. The spray nozzle system 46 can be adapted to spray the gas-expanded liquid 38 in a plurality of spray patterns. The spray nozzle system 46 can direct the gas-expanded liquid 38 onto the substrate 34 for a time period of about 2 to 30 minutes. FIG. 6C illustrates the substrate 34 after the photoresist layer 36 has been substantially removed from the substrate 34 using the gas-expanded liquid 38.

EXAMPLES

Now having described the gas-expanded liquids, methods of use thereof, and systems of using gas-expanded liquids in general, the following describes exemplar embodiments of photoresist removal from a substrate using a carbon dioxide/ethanol or a carbon dioxide/n-methyl pyrrolidone gas-expanded liquid. These examples are not intended to limit the scope of any embodiment of this disclosure, but rather is intended to provide specific exemplary embodiments. Therefore, one skilled in the art would understand that many conditions can be modified to produce a desired result, and it is intended that these modifications be within the scope of the embodiments of this disclosure.

Polyhydroxystyrene (PHOST) samples were treated with carbon dioxide-($CO_2$) expanded ethanol. PHOST is a primary polymer component of many photoresists. Ethanol is a commonly used solvent in the microelectronics industry and is an excellent solvent for complete dissolution of these PHOST films. Liquid $CO_2$, however, does not dissolve these films.

XPS results show that for films in which large amounts of residual polymer remain on the substrate, no silicon is detectable and significant charging of the surface occurs.

Silicon is clearly detected on samples with little residue and with no shift in the observed binding energy occurs due to charging.

These results indicate that the amount of residual polymer remaining corresponds well with the concentration of ethanol in the liquid. For low concentrations of ethanol, little of the polymer is removed, but with up to approximately 75% $CO_2$ in the gas-expanded liquid the solvent ability of the pure ethanol is maintained. This demonstrates that a solvent such as ethanol may be significantly modified (up to about 75%) through expansion with $CO_2$ while maintaining the solvent characteristic of the pure liquid.

In addition, PHOST films were also treated with $CO_2$-expanded n-methyl pyrrolidone (NMP). Similar behavior to that of ethanol is observed, in which mixtures too rich in $CO_2$ do not remove PHOST. Mixtures up to about 70% $CO_2$ remove the film.

Patterned samples were also treated with gas-expanded liquids. These samples are dielectric stacks etched in a fluorocarbon plasma; thus photoresist and post-etch residues remain on the surface and within the patterned features. Although all of these treatments only partially remove residue, gas-expanded liquids show equivalent results to the pure solvent.

Similar studies to these performed with PHOST films were analogously performed with commercially prepared resists from JSR Micro (IXR420H). These films were spin cast and baked at 120° C. for 1 minute. Gas-expanded liquids at pressures up to 5750 kPa fully removed the resist, even at exposure times as little as 1 minute.

It should be emphasized that the above-described embodiments of this disclosure are merely possible examples of implementations, and are set forth for a clear understanding of the principles of this disclosure. Many variations and modifications may be made to the above-described embodiments of this disclosure without departing substantially from the spirit and principles of this disclosure. All such modifications and variations are intended to be included herein within the scope of this disclosure and protected by the following claims.

Therefore, at least the following is claimed:

1. A method of cleaning a substrate, comprising:
   exposing at least a portion of the substrate to a gas-expanded liquid; and
   removing a photoresist layer from the exposed portion of the substrate.
2. The method of claim 1, wherein the gas-expanded liquid includes a gas and a liquid.
3. The method of claim 2, wherein the gas includes carbon dioxide.
4. The method of claim 2, wherein the liquid is selected from alcohols, ketones, organic acids, alkanes, and alkenes.
5. The method of claim 2, further comprising:
   moving the substrate into a container in a cleaning apparatus, wherein the container includes the liquid; and
   increasing the pressure of the gas in the cleaning apparatus to produce the gas-expanded liquid.
6. The method of claim 5, wherein the gas is carbon dioxide and the liquid is an alcohol.
7. The method of claim 2, further comprising:
   submerging the substrate in the gas-expanded liquid.
8. The method of claim 7, further comprising:
   introducing the gas-expanded liquid into a container; and
   moving the substrate into the container so that the substrate is substantially submerged in the gas-expanded liquid.
9. The method of claim 8, wherein the gas is carbon dioxide and the liquid is ethanol.
10. The method of claim 2, further comprising:
    flowing the gas-expanded liquid onto the substrate.
11. The method of claim 10, further comprising:
    disposing at least one flow nozzle substantially above the substrate; and
    flowing the gas-expanded liquid through the nozzle, wherein the gas-expanded liquid contacts the substrate.
12. The method of claim 11, wherein the gas is carbon dioxide and the liquid is n-methyl pyrrolidone.
13. The method of claim 2 further comprising:
    spraying the gas-expanded liquid onto the substrate.
14. The method of claim 13, further comprising:
    disposing the substrate adjacent to at least one spray nozzle; and
    spraying the gas-expanded liquid through the spray nozzle onto the substrate.
15. The method of claim 14, wherein the gas is carbon dioxide.
16. A photoresist cleaning system, comprising:
    a gas-expanded liquid system comprising a gas and a liquid, wherein the gas-expanded liquid system is adapted to generate a gas-expanded liquid; and
    a substrate handling system adapted to position a substrate so that the gas-expanded liquid contacts the substrate to remove a photoresist layer from the substrate.
17. The photoresist cleaning system of claim 16, further comprising:
    a computer control system configured to control the gas-expanded liquid system and the substrate handling system.
18. The photoresist cleaning system of claim 16, wherein the gas-expanded liquid system includes a container to hold the gas-expanded liquid and wherein the substrate handling system is adapted to position the substrate within the container.
19. A substrate cleaned by the following method, comprising:
    exposing at least a portion of the substrate to a gas-expanded liquid; and
    removing a photoresist layer from the exposed portion of the substrate.

* * * * *